United States Patent
Maldonado

[19]

[11] Patent Number: 6,045,367
[45] Date of Patent: Apr. 4, 2000

[54] MULTI-PIN CONNECTOR

[75] Inventor: Ralph Maldonado, Temecula, Calif.

[73] Assignee: Teledyne Industries, Inc., Los Angeles, Calif.

[21] Appl. No.: 08/937,101

[22] Filed: Sep. 24, 1997

[51] Int. Cl.[7] .................................................. H01R 9/09
[52] U.S. Cl. .................................................................. 439/66
[58] Field of Search ........................................ 439/66, 91

[56] References Cited

U.S. PATENT DOCUMENTS

| | | | |
|---|---|---|---|
| 4,021,091 | 5/1977 | Anhalt et al. | 439/260 |
| 4,159,154 | 6/1979 | Arnold | 439/267 |
| 4,538,864 | 9/1985 | Ichimura | 439/69 |
| 4,867,689 | 9/1989 | Redmond et al. | 439/71 |
| 4,976,629 | 12/1990 | Werner | 439/259 |
| 5,139,427 | 8/1992 | Boyd et al. | 439/66 |
| 5,147,207 | 9/1992 | Mowry | 439/66 |
| 5,161,982 | 11/1992 | Mowry | 439/68 |
| 5,380,210 | 1/1995 | Grabbe et al. | 439/66 |
| 5,395,252 | 3/1995 | White | 439/66 |
| 5,462,440 | 10/1995 | Rothenberger | 439/66 |
| 5,746,607 | 5/1998 | Bricaud et al. | 439/66 |

*Primary Examiner*—Neil Abrams
*Assistant Examiner*—T C Patel
*Attorney, Agent, or Firm*—Nydegger & Associates

[57] ABSTRACT

A pin grid array includes a base having a first surface and a second surface which is substantially parallel thereto. The base is formed with a plurality of apertures which open through the base, and a plurality of electrical connectors are mounted on the base. Specifically, the connectors are formed with a central portion, and each connector has two deflectable fingers which extend in opposite directions from this central portion. The central portion of the connector is embedded into the base to cantilever the fingers into juxtaposed apertures. When they are not deflected, one finger of the connector projects outwardly from its aperture and beyond the first surface of the base, while the other finger projects outwardly from its aperture and beyond the second surface of the base. In a plurality of apertures, one finger projects one way and another finger projects the other way. With this combination, the electrical contact tips of the fingers are arranged as two matrices, one over the first surface of the base and the other over the second surface. Thus, a plurality of circuits are established between the first surface of the array and the second surface.

18 Claims, 2 Drawing Sheets

MULTI-PIN CONNECTOR

FIELD OF THE INVENTION

The present invention pertains generally to electrical connectors. More specifically, the present invention pertains to deflection beam electrical connectors which project from a base member to establish electrical contact between electrical devices. The present invention is particularly, but not exclusively, useful for establishing a plethora of electrical circuits between electrical devices.

BACKGROUND OF THE INVENTION

Many electrical devices require connection with the electrical circuits of other electrical devices in order for them to function properly. Indeed, it is not uncommon for an electrical device to require simultaneous connection with a great many electrical circuits in other devices. To satisfy this requirement, connectors have been developed that can establish as many as seven or eight hundred different electrical circuits between electrical devices. A commonly used term for such connectors is; "pin grid array".

Typically, a pin grid array will include a generally flat base member, and will have a multitude of individual electrical connectors. For most applications, these connectors are mounted as an array on the base member and extend from both sides thereof to establish as many different electrical pathways through the base member of the array.

A commonly used component for the individual electrical connectors of a pin grid array is a deformable, electrically conductive, wire mesh structure known as a "fuzz button". In addition to establishing an electrical pathway, an important attribute of these so-called fuzz buttons is that they are inherently resilient and flexible. This resilience and flexibility, however, can be both beneficial and detrimental to the performance of the pin grid array.

On the one hand, resilience and flexibility in an electrical connector are desirable in that these qualities promote the proper engagement of an electrical connector with an electrical device. For instance, some relative movement between the connector and the device is beneficial for causing a "wiping" action which helps assure electrical contact between the device and the connector, and thereby establish the electrical pathway through the connector. Further, some flexibility between electrical components is advantageous in order to accommodate variations in the tolerances that are engineered into electrical devices. Although fuzz buttons are generally highly deformable, and easily accommodate tolerance variations, they can become misshapen with extended repetitive use. Thus, they are prone to giving uneven contact pressures between the various electrical contact points. For the same reason, fuzz buttons are prone to loosing their registration with the contact points on the electrical connector to which they are mated. With either uneven contact pressures or lost registration, essential electrical circuits may not be established by the pin grid array. To overcome these shortcomings, other electrical contact structures need to be considered.

Electrical contact fingers which are mounted on base members, and which are cantilevered therefrom, have certain structural attributes which are beneficial to an electrical connector. First, a cantilevered contact finger can be engineered to have a requisite flexibility. Second, the finger can be engineered to maintain structural integrity and dependability over a prolonged duty life. Further, when used within engineered limitations, solid fingers are minimally susceptible to becoming deformed or misshapen. Thus, they are able to effectively maintain their strength and their ability to be repetitively repositioned in register.

In light of the above, it is an object of the present invention to provide a pin grid array which will establish reliable electrical circuits, despite repeated use over a prolonged period of time. Another object of the present invention is to provide a pin grid array which effectively maintains registration for a plethora of electrical circuits. Still another object of the present invention is to provide a pin grid array which is adaptable for engagement with different types of electrical devices. Yet another object of the present invention is to provide a pin grid array which is simple to use, relatively easy to manufacture and comparatively cost effective.

SUMMARY OF THE PREFERRED EMBODIMENTS

A pin grid array in accordance with the present invention includes a substantially flat plate-like base which is made of a rigid dielectric material such as plastic. The base has a flat top (first) surface and a flat bottom (second) surface, and is formed with a plurality of apertures which extend through the base from surface to surface. These apertures are arranged in rows and columns to form a matrix.

A plurality of electrical connectors are mounted on the base. Specifically, each connector has a central portion and a pair of integral fingers which extend from the central portion. In relation to the central portion, the fingers are off-set from each other so that their respective axes are substantially parallel to each other, and each of the fingers extends from the central portion in a direction that is substantially opposite to that of the other finger. When mounted on the base, the central portion of each connector is embedded into the base. When embedded into the base, the connector is oriented so that one finger of the connector extends into one aperture of the base while the other finger of the connector extends into another aperture of the base. Thus, the fingers are effectively cantilevered from the base into juxtaposed apertures.

As intended for the present invention, in addition to being cantilevered into juxtaposed apertures, the fingers are also angled such that their respective tips project outwardly from a surface of the base. Specifically, the tip of one finger of each connector projects outwardly from the top (first) surface of the base, while the tip of the other finger projects outwardly from the bottom (second) surface of the base. With this cooperation of structure, an electrical circuit is established by each connector which extends through the pin grid array from one surface to the other surface. Additionally, it is to be noted that the cantilevered fingers, with their respective tips, are deflectable. As alluded to above, finger deflectability is desirable in order to provide the resilience and flexibility necessary for an effective wiping action between the connector finger and the electrical contact of an electrical device. It also accommodates variations in engineered tolerances between electrical devices that are connected through the pin grid array. Furthermore, finger deflectability also establishes a biasing force which urges the finger into electrical contact with the associated electrical device.

For the assembled pin grid array of the present invention, the connector tips that project outwardly from the first surface of the base are arranged in a plane as a matrix having a plurality of rows and a plurality of columns. Similarly, the connector tips that project outwardly from the second surface of the base are arranged in a parallel plane as a matrix having a plurality of rows and a plurality of columns. Consequently, the pin grid array is capable of electrically connecting a plethora of in-plane contacts from one electrical device with a plethora of in-plane contacts of another such device.

In the manufacture of the pin grid array of the present invention, a pattern of a plurality of connectors is stamped or chemically etched from a sheet of electrically conductive material, such as a metal. At the time the sheet metal is stamped or etched, the connector fingers can be appropriately angled from the respective central portions of the connectors. The connector fingers can be angled subsequently if desired. Further, the tips of the connector fingers can be plated with gold to enhance the electrical contact between the connector finger and the electrical device that is to be later engaged with the pin grid array.

After the pattern of connectors has been stamped from the sheet, the stamped sheet is placed in the cavity mold of an injection molding machine, and a plastic material is molded onto the sheet. Specifically, the plastic is injection molded onto the sheet to form a substantially flat base for the pin grid array which has a first (upper) surface and an opposite second (lower) surface. As molded, the base has a plurality of apertures that extend through the base from one surface to the other, and there are two connector fingers which extend from the base into each of the apertures. The two connector fingers in an aperture, however, are from different juxtaposed connectors. Further, one finger in each aperture extends outwardly from the aperture in one direction, past the first surface, and the other finger in the aperture extends outwardly from the aperture in the opposite direction, past the second surface.

Once the base has been injection molded onto the stamped sheet of electrical connectors, the various electrical connectors are electrically isolated from each other. This is accomplished through a process called singulation. Specifically, by the process of singulation, the tie bars which previously joined the electrical connectors together are removed. This is done by methods well known in the art, such as by mechanical or laser means.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
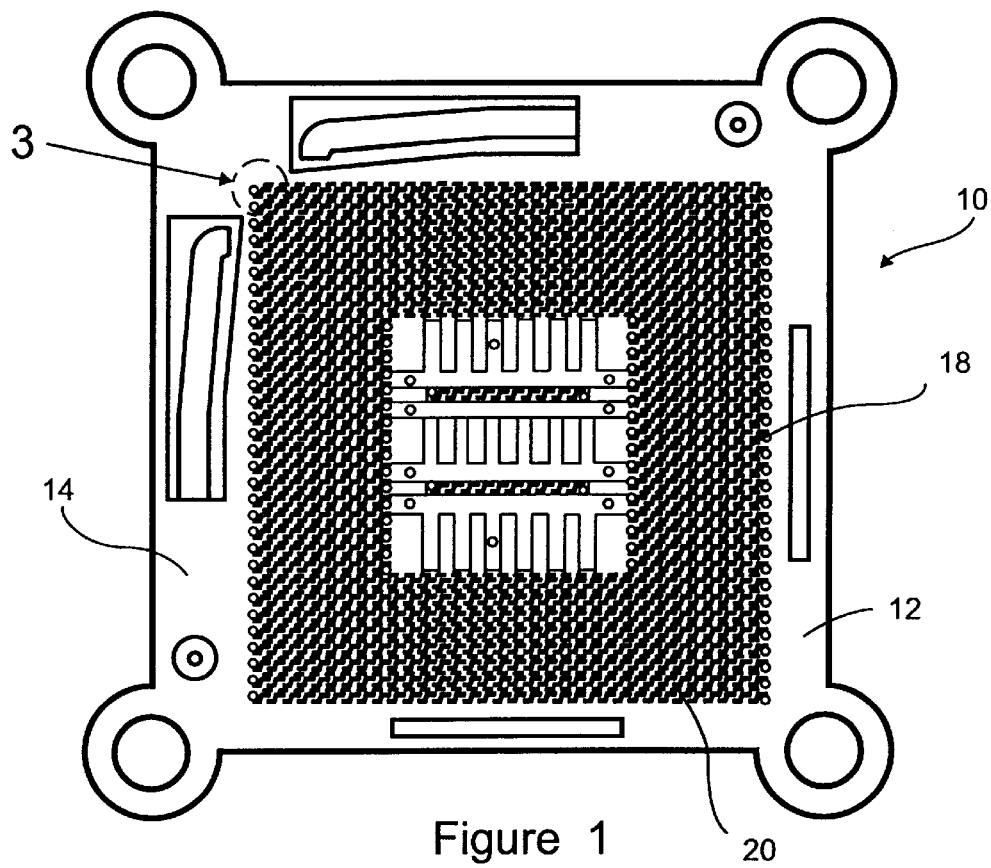
FIG. 1 is a a top plan view of a pin grid array according to the present invention.
Figure 2:
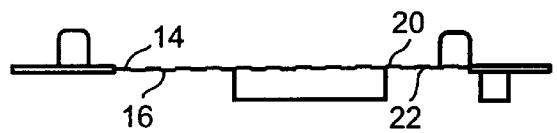
FIG. 2 is a side elevation view of the pin grid array according to the present invention.

Referring initially to FIG. 1, a pin grid array in accordance with the present invention is shown and generally designated 10. By cross referencing FIG. 1 and FIG. 2, it will be appreciated that the array 10 includes a base 12 which is substantially flat and which defines an upper surface 14 and a lower surface 16. As intended for the present invention, the base 12 is made of a dielectric material, such as plastic.

In overview, the pin grid array 10 of the present invention includes a plurality of electrical connectors 18 which are arranged on the base 12 to establish a matrix 20 of electrical contact points that extend outwardly from the upper surface 14. Similarly, the plurality of electrical connectors 18 also establish a matrix 22 of electrical contact points which extend outwardly from the lower surface 16. All of the connectors 18 are made of an electrically conducting material, such as a metal, and are oriented on the base 12 to establish a plurality of electrical circuit connections which pass from the upper surface 14 to the lower surface 16. With this arrangement, the matrix 20 and upper surface 14 of pin grid array 10 are engageable with an electronic device (not shown), while the matrix 22 and lower surface 16 of pin grid array 10 are engageable with another electronic device (also not shown).

Figure 3A:
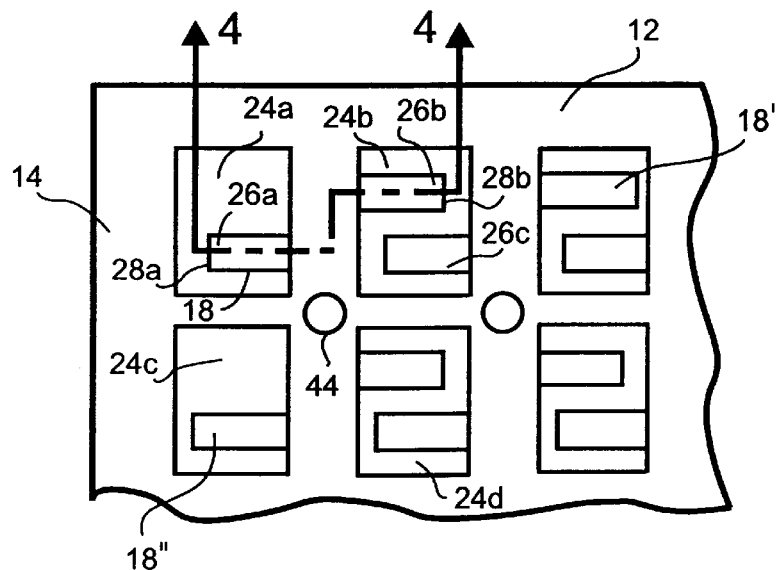
FIG. 3A is a top view of a portion of the pin grid array taken from the circled portion shown in FIG. 1 and designated with the numeral 3.
Figure 3B:
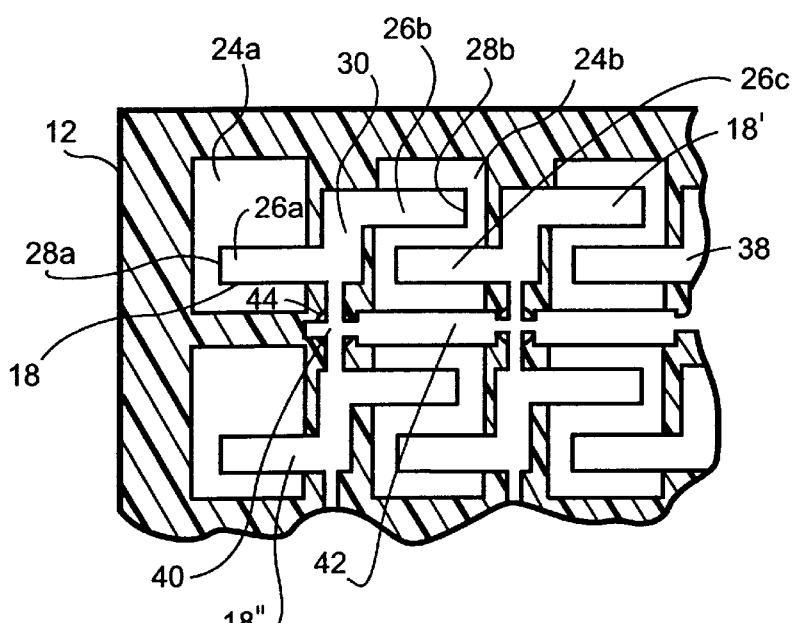
FIG. 3B is a top cross sectional view of the pin grid array portion shown in FIG. 3A with an overlying layer of the base removed to expose connectors of the pin grid array.

Referring now to FIGS. 3A and 3B, it will be seen that the base 12 of pin grid array 10 is formed with a plurality of apertures 24, of which the apertures 24a–d are representative. These apertures 24 extend through the base 12 from first surface 14 to second surface 16 and are preferably arranged in rows and columns substantially as shown. Further, as perhaps best appreciated with reference to FIG. 3B, each of the connectors 18 extend from the base 12 into two adjacent juxtaposed apertures 24. Specifically, consider the connector 18. Connector 18 includes two fingers 26a and 26b which have respective tips 28a and 28. Further, the two fingers 26a and 26b are integral with a central portion 30 and extend from the central portion 30 into the respective apertures 24a and 24b. A more detailed appreciation of the cooperation between the base 12 and each individual connector 18 in the pin grid array 10 is possible with reference to FIG. 4.

Figure 4:
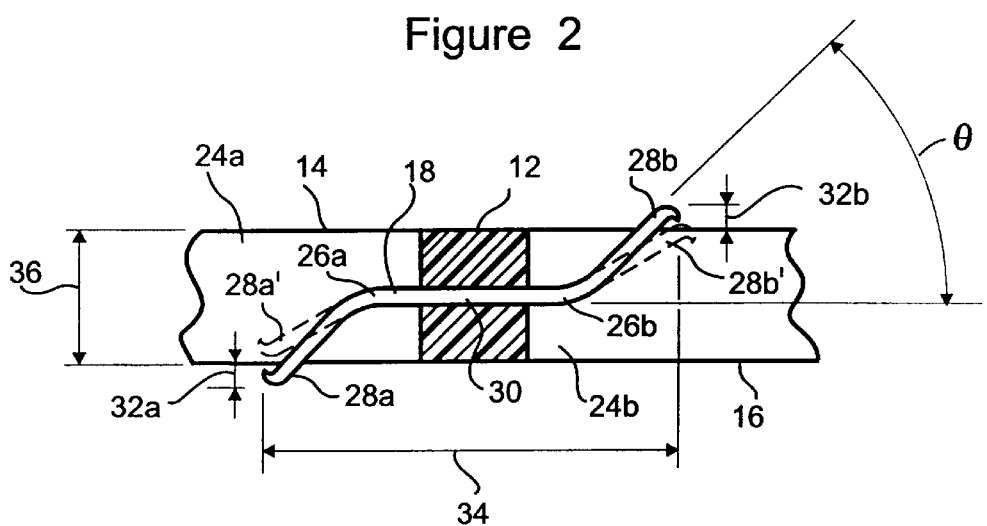
FIG. 4 is a cross sectional view of a connector embedded in the base as seen along the line 4—4 in FIG. 3A.

In FIG. 4 it can be seen that the central portion 30 of the connector 18 is actually embedded into the base 12. Additionally, it can be seen that the finger 26a is cantilevered into aperture 24a, and that the finger 26b is cantilevered into aperture 24b. As shown in FIG. 4, each of the fingers 26a, 26b of connector 18 are bent at an angle θ so that the respective tips 28a, 28b protrude from the apertures 24a, 25b. Preferably, θ is approximately equal to 45° and the tips 28a and 28b protrude outwardly from and beyond the respective surfaces 16, 14 of base 12. Specifically the tip 28a extends beyond the lower surface 16 through a deflection distance 32a, and the tip 28b extends beyond the upper surface 14 through a deflection distance 32b. The deflection distances 32a, 32b are preferably around ten thousandths of an inch (0.010 in.). When the fingers 28a, 28b are bent, the connector 18 will have a configured length 34, as shown in FIG. 4. For the present invention, the configured length 34 will be approximately sixty thousandths of an inch (0.060 in.). Also, as best seen in FIG. 4, the thickness 36 of base 12 from the upper surface 14 to the bottom surface 16 will be about eighteen thousandths of an inch (0.018 in.).

In the manufacture of the pin grid array 10 for the present invention, the plurality of the connectors 18 are stamped from a sheet 38 in a manner well known in the pertinent art. As intended for the present invention, all of the connectors 18 remain joined together at this stage of manufacture. The resultant pattern of connectors 18 which shows all of the connectors 18 joined together is, perhaps, best appreciated with reference to FIG. 3B.

As shown in FIG. 3B, the stamped connectors 18 are initially joined together by tie bars 40 and, in turn, the tie bars 40 are appropriately joined together by cross bars 42. In addition to forming the plurality of connectors 18 during this initial stamping procedure, It will be appreciated that the fingers 26 of respective connectors 18 can also be formed with the angle θ during this initial stamping. On the other hand, the angle θ can be established subsequently, if desired. Further, the tips 28 of the fingers 26 can be plated to enhance their electrical contact abilities. Preferably, this plating is done with gold, and is approximately thirty microns thick. In any case, once connectors 18 have been stamped, the stamped sheet 38 is then placed in the mold of an injection molding machine (not shown). Next, the base 12 is injection molded around portions of the sheet 38.

The injection molding of base 12 onto and around portions of the stamped sheet 38 of connectors 18 is accomplished to achieve a certain orientation for the connectors 18 relative to the base 12. Specifically, the central portions 30 of all of the various connectors 18 are embedded into the base 12. This anchors the connectors 18 into the base 12. Additionally, as clearly shown by cross referencing FIGS. 3A, 3B and 4, the fingers 26 of all of the connectors 18 are cantilevered from the base 12 into juxtaposed apertures 24. For example, the fingers 26a, 26b of connector 18 are cantilevered in opposite directions into the juxtaposed apertures 24a, 24b. Further, their tips 28a, 28b extend beyond opposite surfaces 16, 14 of the base 12. Thus, an electrical circuit is established through the connector 18.

As appreciated by reference to FIGS. 3A and 3B, an aperture 24 can accommodate two fingers 26, with each finger 26 being from a different connector 18. For example, consider the connectors 18 and 18', and the aperture 24b. The finger 26b of connector 18 and the finger 26c of connector 18' are both cantilevered into the aperture 24b. Preferably, while the finger 26b of connector 18 extends beyond the upper surface 14 of base 12, the finger 26c from the connector 18' will extend beyond the lower surface 16 of base 12. A similar arrangement of fingers 26 in apertures 24 thus continues in rows and columns throughout the pin grid array 10.

Once the connectors 18 have been embedded into the base 12 as disclosed above, the connectors are electrically isolated from each other. This is done by a process generally referred to as "singulation". Specifically, the tie bars 40 (shown in FIG. 3B) are removed. This can be done either mechanically or by any other means known in the art, such as by lasers. Access to the tie bars 40 for purpose of disconnecting the connectors 18 from each other is provided by the holes 44 (shown in FIG. 3A) which are formed in the base 12 during the injection molding process. Singulation can be accomplished either while the base 12 is still in the mold, or after the combination of base 12 and connectors 18 is removed from the mold.

Figure 5:
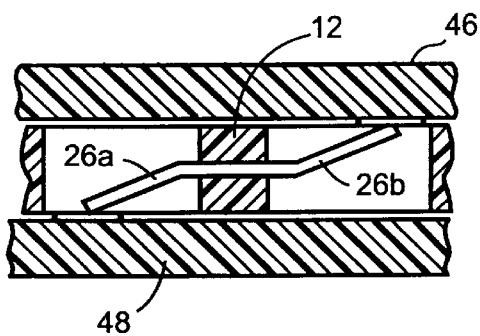
FIG. 5 is a cross selectional view of the connector as shown in FIG. 4 interconnect a first electrical device a second electrical device.

In the operation of the pin grid array 10 of the present invention, FIG. 5 shows that electrical devices 46, 48 are engaged with the base 12. Upon engagement the contact point on the electrical devices will depress the fingers 26 of the various connectors 18 in the array 10. With this depression, the tips 28 of the fingers 26 move through a deflection distance 32 and into a position shown by the deflected fingers 28a' and 28b' in FIG. 4. With this engagement, each connector 18 in the array 10 establishes a separate electrical circuit between the electrical devices.

While the particular MULTI-PIN CONNECTOR as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A pin grid array which comprises:

a base having a first surface and a second surface with said second surface being substantially parallel to said first surface, said base formed with a plurality of apertures with each said aperture being open through said base from said first surface to said second surface; and a plurality of connectors with each said connector being mounted in said base between two said apertures, said connector having a first finger with a deflectable tip cantilevered from said base into one respective said aperture to project said tip thereof outwardly beyond said first surface of said base, and having a second finger with a deflectable tip cantilevered from said base into another respective said aperture to project said tip thereof outwardly beyond said second surface of said base, said tips of said first fingers and said tips of said second finders being arranged as a respective matrix with a plurality of rows and a plurality of columns to define a respective first plane and second plane to establish a plurality of electrical circuits through said connectors from said first surface of said base to said second surface of said base.

2. A pin grid array as recited in claim 1 wherein each said aperture has one said first finger and one said second finger cantilevered therein.

3. A pin grid array as recited in claim 1 wherein said tips of said first fingers and said tips of said second fingers are gold plated to at least a thickness of thirty micro-inches (30 μin).

4. A pin grid array as recited in claim 1 wherein said tips of said first fingers project outwardly from said first surface approximately ten thousandths of an inch (0.010 in) when not deflected and are substantially in-plane with said first surface when deflected, and said tips of said second fingers project outwardly from said second surface approximately ten thousandths of an inch (0.010 in) when not deflected and are substantially in-plane with said second surface when deflected.

5. A pin grid array as recited in claim 1 wherein said base is made of a rigid plastic.

6. A pin grid array as recited in claim 5 wherein said connectors are made from a sheet of stamped metal, said metal sheet being approximately two thousandths of an inch thick (0.002 in), and wherein said base is injection molded onto said stamped sheet.

7. A pin grid array for establishing a plurality of electrical circuits between a first electrical device and a second electrical device, said array comprising:

a base fixedly positioned between said first device and said second device, said base being formed with a plurality of apertures therethrough; and a plurality of connectors, each said connector having a central portion with a first deflectable finger having a tip and a second deflectable finger having a tip extending therefrom, said central portion of each said connector being embedded in said base between juxtaposed apertures to cantilever said first finger from said base into one respective said aperture for urging said first finger into electrical contact with said first device, and to cantilever said second finger from said base into another respective said aperture for urging said second finger into electrical contact with said second device, said tips of said first fingers and said tips of said second fingers being arranged as a respective matrix with a plurality of rows and a plurality of columns to define a respective first plane and second plane, said first plane being substantially parallel to said second plane with each tip in said first plane being electrically connected to a respective tip in said second plane.

8. A pin grid array as recited in claim 7 wherein each said aperture has one said first finger and one said second finger cantilevered therein.

9. A pin grid array as recited in claim 7 wherein said tips of said first fingers and said tips of said second fingers are gold plated to at least a thickness of thirty micro-inches (30 $\mu$in).

10. A pin grid array as recited in claim 7 wherein said base has a first surface and a second surface, and wherein said tips of said first fingers project outwardly from said first surface approximately ten thousandths of an inch (0.010 in) when not deflected and are substantially in-plane with said first surface when deflected, and said tips of said second fingers project outwardly from said second surface approximately ten thousandths of an inch (0.010 in) when not deflected and are substantially in-plane with said second surface when deflected.

11. A pin grid array as recited in claim 7 wherein said base is made of a rigid plastic.

12. A pin grid array which comprises:

a base formed with a plurality of apertures;

a plurality of first electrical contact tips cantilevered from said base and arranged as a matrix with a plurality of rows and a plurality of columns to define a first plane with each said first electrical contact tip projecting from said base through a respective said aperture; and a plurality of second electrical contact tips cantilevered from said base and arranged as a matrix with a plurality of rows and a plurality of columns to define a second plane with each said second electrical contact tip projecting from said base through a respective said aperture, said first plane being substantially parallel to said second plane, with each said first electrical contact tip in said first plane being electrically connected to a respective said second electrical contact tip in said second plane to establish a plurality of electrical circuits between said first plane and said second plane, and wherein each said electrical circuit has a first electrical contact tip in one said aperture and a second electrical contact tip in another said aperture.

13. A pin grid array as recited in claim 12 wherein said base is formed with a plurality of apertures and a plurality of said apertures have one said tip from said first plane cantilevered therein and one said tip from said second plane cantilevered therein.

14. A pin grid array as recited in claim 12 wherein said tips in said first plane and said tips in said second plane are deflectable.

15. A pin grid array as recited in claim 14 wherein said base has a first surface and a second surface and wherein said tips of said first plane project outwardly from said first surface approximately ten thousandths of an inch (0.010 in) when not deflected and are substantially in-plane with said first surface when deflected, and said tips of said second fingers project outwardly from said second surface approximately ten thousandths of an inch (0.010 in) when not deflected and are substantially in-plane with said second surface when deflected.

16. A pin grid array as recited in claim 12 wherein said tips in said first plane and said tips in said second plane are gold plated to at least a thickness of thirty micro-inches (30 $\mu$in).

17. A pin grid array as recited in claim 12 wherein said base is made of a rigid plastic.

18. A pin grid array as recited in claim 17 wherein said electrical contact tips are made from a sheet of stamped metal, said metal sheet being approximately two thousandths of an inch thick (0.002 in), and wherein said base is injection molded onto said stamped sheet.

* * * * *